United States Patent [19]

Obinata

[11] Patent Number: 5,011,793

[45] Date of Patent: Apr. 30, 1991

[54] VACUUM DEPOSITION USING PRESSURIZED REFLOW PROCESS

[75] Inventor: Hisaharu Obinata, Hatano, Japan

[73] Assignee: Nihon Shinku Gijutsu Kabushiki Kaisha, Kanagawa, Japan

[21] Appl. No.: 540,163

[22] Filed: Jun. 19, 1990

[51] Int. Cl.⁵ ............................................. H01L 21/90
[52] U.S. Cl. ..................................... 437/203; 437/67; 437/78; 437/79
[58] Field of Search ................... 437/67, 78, 79, 203; 198/DIG. 50

[56] References Cited

U.S. PATENT DOCUMENTS 4,920,070  4/1990  Mukai .................................. 437/203

FOREIGN PATENT DOCUMENTS 0172327  8/1986  Japan .................................. 437/203
0293739  12/1987  Japan .................................. 437/203
0137453  6/1988  Japan .................................. 437/203
0204630  8/1988  Japan .................................. 437/203

Primary Examiner—Olik Chaudhuri
Assistant Examiner—Ourmazd Ojan
Attorney, Agent, or Firm—Larson and Taylor

[57] ABSTRACT

A thin film forming method for a substrate having one or more recesses using a vacuum deposition wherein the thin film to be formed on the substrate is heated and melted, and the melted material of the thin film is pressurized and forced into each recess so as not to have any void in the thin film.

9 Claims, 3 Drawing Sheets

VACUUM DEPOSITION USING PRESSURIZED REFLOW PROCESS

BACKGROUND OF THE INVENTION

The present invention relates to a vacuum deposition using pressurized reflow process, and more particularly to a method of forming a metal thin film on the substrate without producing any void in each recess.

It is known to form a metal thin film on a substrate having recesses using a sputtering method. An example of such a conventional metal thin film forming method is illustrated in FIGS. 1 to 3. As will be seen in FIG. 1, in case a thin film 1 of a metal material such as an alloy containing aluminium as a main composition is formed on a substrate 2 provided with a recess 3, a hollow 4 may be generated in the center region of the recess 3. In order to avoid the generation of such a hollow 4, the thin film 1 of the aluminium containing alloy formed on the substrate 2 is heated at temperature above approximately 500° C. in case of Al based alloys so that it is melted. The melted metal of the thin film 1 may be drifted into the recess 3 so as to fill the recess 3 with the melted metal as shown in FIG. 2 and then may be cooled. It should be understood that the wording "melted" used herein is intended to include the conception of a softening or a fluidization.

However, in case the recess 3 provided on the substrate 2 is fine and has an aspect ratio of one or more, the melted metal can not be successfully drifted into the recess 3 and consequently a void 5 is left in the recess 3, which is surrounded by the metal of the thin film 1 as shown in FIG. 3.

SUMMARY OF THE INVENTION

It is therefore an object of the present invention to provide a method of forming a thin film on a substrate having one or more recesses without any void being generated in each recess.

According to one aspect of the present invention, there is provided a method of forming a thin film on a substrate having one or more recesses without any void being generated in each recess, comprising the steps of forming the thin film on the substrate, heating the thin film formed on the substrate to cause it to be melted and to close the entrance of each recess by the melted material, and acting a gas on the melted material of the thin film to be pressurized so that the melted material is filled into each recess of the substrate thereby generating no void in each recess.

The forming of the thin film on the substrate may be performed by a sputtering, CVD process, a vacuum vapor deposition or the like.

According to a second aspect of the present invention, there is provided a method of forming a thin film on a substrate having one or recesses without any void being generated in each recess, comprising the steps of forming the thin film on the substrate, heating the thin film formed on the substrate to cause it to be melted and to close the entrance of each recess by the melted material while the thin film is formed on the substrate, and acting a gas on the melted material of the thin film to be pressurized so that the melted material is filled into each recess of the substrate thereby forming no void in each recess.

Preferably, the heating of the thin film on the substrate may be commenced on the way to form the thin film on the substrate.

The present invention will now be described by way of example with reference to the accompanying drawings.

DETAILED DESCRIPTION

With reference to FIGS. 4 to 7 there are shown the steps in the formation of a metal thin film 6 of an alloy containing aluminum as a main component on a substrate 7 by using a sputtering method in accordance with one embodiment of the present invention.

Figure 1:
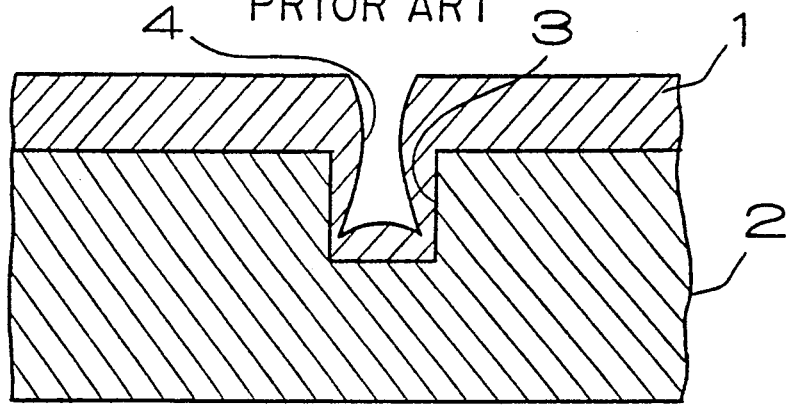
FIG. 1 is a sectional view schematically showing one step in a process of a prior art in which a metal thin film of alloy containing aluminum as a main component is formed on a substrate having a recess by using a sputtering method.
Figure 2:
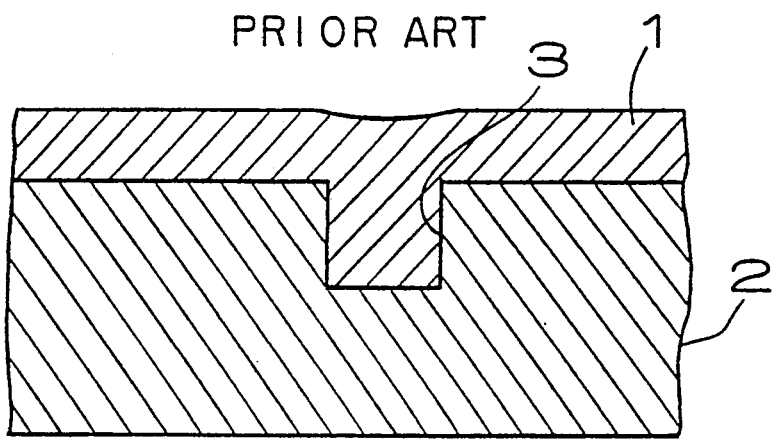
FIG. 2 is a sectional view showing another step of the process of the prior art in which the recess is filled with the metal of the thin film.
Figure 3:
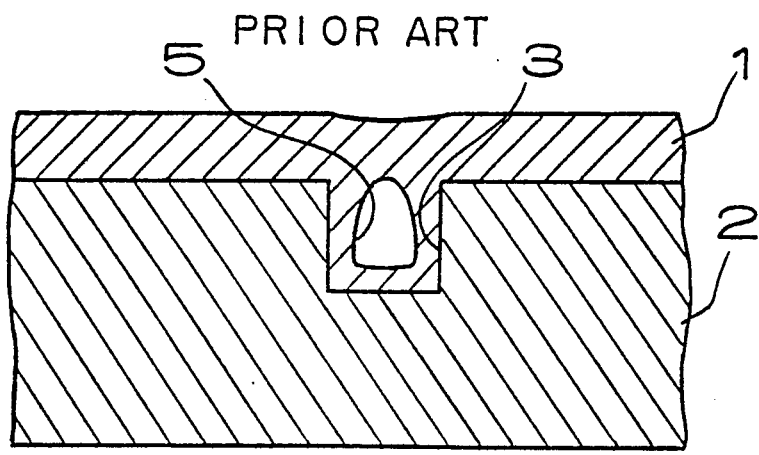
FIG. 3 is a sectional view of the construction of the metal thin film on the substrate at the final stage of the process of the prior art illustrating that a void is produced in the recess and is surrounded by the metal of the thin film.
Figure 4:
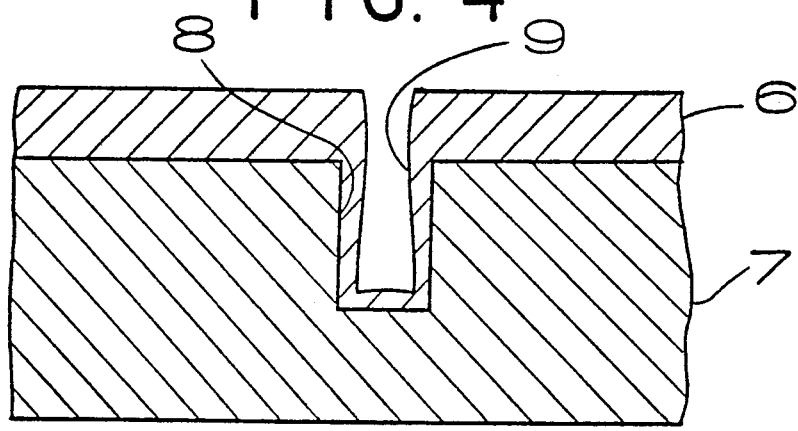
FIG. 4 is a sectional view schematically showing one step in a process according to the present invention in which a metal thin film of an alloy containing aluminum as a main component is formed on a substrate having a recess by using a sputtering method.

The substrate 7 is provided with a recess 8 which comprises a fine hole or groove having an aspect ratio of one or more. The substrate 7 is introduced into a vacuum chamber of a vacuum processing apparatus, not shown, for forming the metal thin film 6 thereon. When the metal thin film 6 is formed on the substrate 7, the metal thin film 6 is deposited on the inner surface of the recess 8 as well as the upper surface of the substrate 7, and thus, as will be seen in FIG. 1, a hollow region 9 may be produced in the center portion of the recess 8.

Figure 5:
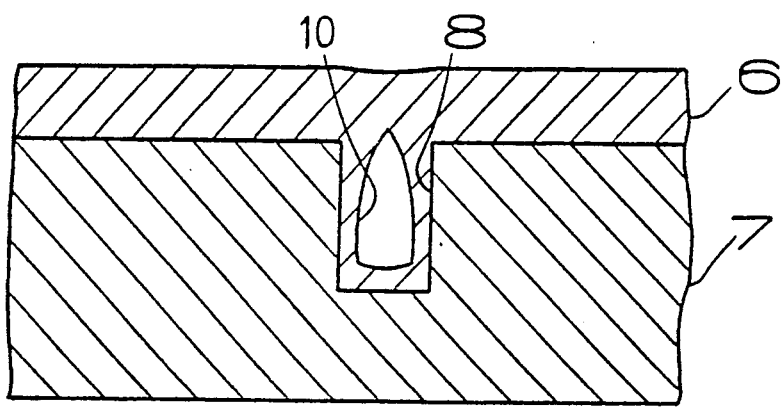
FIG. 5 is a sectional view illustrating the stage that the metal thin film on the substrate is heated to be melted by a heater.
Figure 6:
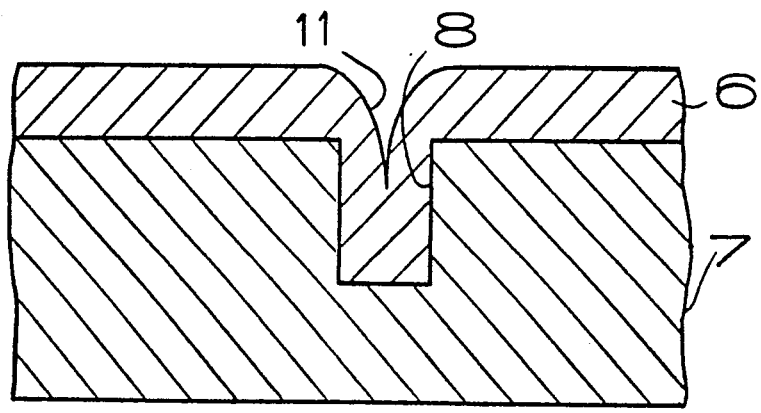
FIG. 6 is a sectional view illustrating the stage of the process of the present invention that the melted metal of the thin film is forced into the recess of the substrate by means of the pressure of a gas such as Ar introduced into a vacuum chamber in which the substrate is disposed.

Then, the metal thin film 6 thus formed on the substrate 7 is heated at a temperature above approximately 500° C. in case of Al based alloys by means of a heater, not shown, and thus is melted. Consequently, there may be provided a void 10 in vacuum atmosphere within the recess 8, as shown in FIG. 5.

Figure 7:
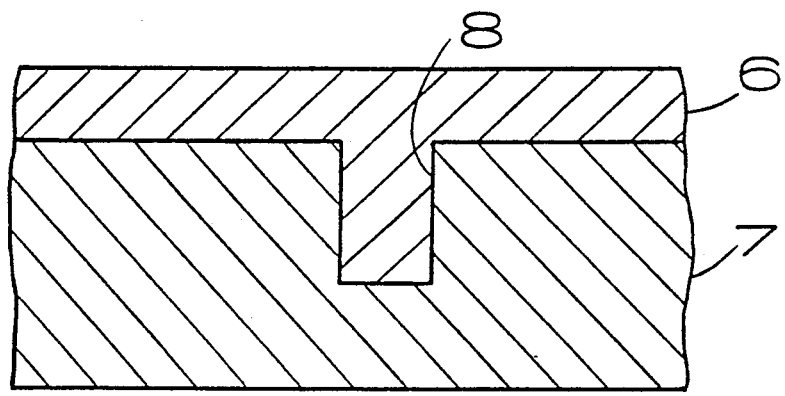
FIG. 7 is a sectional view showing the completed metal thin film on the substrate in the final stage of the process of the present invention.

In order to avoid the generation of such a void 10 within the recess 8, a gas such as Ar is introduced into the vacuum chamber so that the pressure in the vacuum chamber becomes higher than that in the void 10, whereby the metal thin film 6 melted in the previous step is pressurized. In this way, there is induced a substantial difference between the pressure in the vacuum chamber and that in the void 10, by which the metal of the thin film 6 is forced into the recess 8. In this connection, at the initial stage of this procedure, as will be seen in FIG. 6, the void 10 in the recess 8 disappears, but alternatively there appears a hollow portion 11 of an inverted conical shape in the center region of the recess 8. At the final stage of this procedure the melted metal of the thin film 6 flows into the hollow portion 11 so that it becomes extinct and thus the upper surface of the metal thin film 6 becomes smooth as shown in FIG. 7.

After the melted metal of the metal thin film 6 is drifted into the hollow portion 11 so as to fill it up, the substrate 7 and the metal thin film 6 are cooled.

In this way, the metal thin film 6 can be formed on the substrate 7 without appearing of void in the recess 8.

In the illustrated embodiment, alternatively, the formation of the metal thin film 6 on the substrate 7 may be performed by any suitable growing process in gaseous phase such as CVD method or vacuum vapor deposition.

Also, in the processing of the illustrated embodiment, the heating of the metal thin film 6 on the substrate 7 may be carried out by vacuum processing apparatus used for forming the metal thin film, or alternatively this may be done by providing a separate heater device. In the latter case, the substrate with the metal thin film formed thereon is disposed in the heater device which is evacuated and then is operated to heat the metal thin film. After heating of the metal thin film, a gas such as Ar is introduced into the heater device in order to prevent any void from being produced in the recess of the substrate during the formation of the thin film on the substrate.

Furthermore, the heating process may be carried out during the formation of the metal thin film on the substrate or before the thin film is formed on the substrate.

In the modification of the present invention, the heating process is commenced on the way to form the metal thin film on the substrate, and the deposition of the metal thin film on the substrate is continued. After deposition of the metal thin film or just before the deposition is finished the gas such as Ar is introduced into the the vacuum chamber in which the substrate is disposed.

In this modified embodiment, alternatively, the heating of the metal thin film may be commenced as the same time as the commencement of the deposition of the metal thin film on the substrate.

As described above, according to the present invention, the metal thin film is heated and melted after or during formation thereof, and then is pressurized by the gaseous medium to force it into the recess on the substrate. Therefore, it is possible to provide a metal thin film on the substrate without producing any void in the recess, even if the recess on the substrate has a higher aspect ratio.

Also, the present invention can be applied for forming a thin film of metal having a lower melting point than that of a substrate having one or more recesses thereon.

It is to be understood that the present invention is not limited to the particular embodiments described and illustrated and that numerous modifications and alterations may be made by those skilled in the art without departing from the spirit and scope of the invention.

I claim:

1. A method of forming a thin film on a substrate having one or more recesses without void being generated in each recess, comprising the steps of forming the thin film on the substrate in a vacuum atmosphere, heating the thin film formed on the substrate to cause it to be melted and to close the entrance of each recess by the melted material, and exposing the melted material of the thin film to a pressurized gas so that the melted material is filled into each recess of the substrate thereby removing voids in each recess.

2. A method according to claim 1, wherein the forming of the thin film on the substrate is performed by any one of a sputtering, CVD process, a vacuum vapor deposition or the like.

3. A method according to claim 1, wherein the thin film comprises alloy containing aluminum as a main composition and/or one or more materials which have lower melting point than that of the substrate.

4. A method according to claim 1, wherein said each step is carried out within the same vacuum chamber.

5. A method according to claim 1, wherein the heating process is carried out by separate heating device in which the substrate provided with the thin film is disposed.

6. A method according to claim 5, wherein the melted material of the thin film is pressurized by feeding the gas into said separate heating device.

7. A method of forming a thin film on a substrate having one or more recesses without void being generated in each recess, comprising the steps of forming the thin film on the substrate, heating the thin film formed on the substrate to cause it to be melted and to close the entrance of each recess by the melted material while the thin film is formed on the substrate, and exposing the melted material of the thin film to a pressurized gas so that the melted material is filled into each recess of the substrate thereby removing voids in each recess.

8. A method according to claim 7, wherein the heating process is commenced during the formation of the thin film on the substrate.

9. A method according to claim 7, wherein the thin film comprises alloy containing aluminum as a main composition and/or one or more materials which have lower melting point than that of the substrate.

* * * * *